US006403490B1

United States Patent
Lagarde et al.

(10) Patent No.: US 6,403,490 B1
(45) Date of Patent: Jun. 11, 2002

(54) METHOD OF PRODUCING A PLASMA BY CAPACITIVE-TYPE DISCHARGES WITH A MULTIPOLE BARRIER, AND APPARATUS FOR IMPLEMENTING SUCH A METHOD

(75) Inventors: Thierry Lagarde, Vif; Jacques Pelletier, Saint Martin d'Heres, both of (FR)

(73) Assignee: Metal Process (Societe a Responsabilite Limitee), Montevrain (FR)

( * ) Notice: Subject to any disclaimer, the term of this patent is extended or adjusted under 35 U.S.C. 154(b) by 0 days.

(21) Appl. No.: 09/691,141

(22) Filed: Oct. 19, 2000

(30) Foreign Application Priority Data

Oct. 19, 1999 (FR) ............................................. 99 13305

(51) Int. Cl.$^7$ .......................... H01L 21/00; H05H 1/00; C23C 16/00
(52) U.S. Cl. ........................ 438/710; 216/71; 427/571; 118/723 E; 156/345.47; 156/345.49
(58) Field of Search ................................ 438/710, 712, 438/714, 728; 216/71, 67, 70; 427/571, 569; 118/723 E, 723 MA, 723 MR; 156/345.49, 345.47

(56) References Cited

U.S. PATENT DOCUMENTS 5,627,435 A * 5/1997 Jansen et al. ............ 315/111.21
5,733,405 A * 3/1998 Taki et al. .................. 156/345
5,772,772 A * 6/1998 Chi ....................... 118/723 MA
5,936,352 A * 8/1999 Samukawa et al. ..... 315/111.51

FOREIGN PATENT DOCUMENTS

| EP | 0552491 | | 7/1993 | |
|---|---|---|---|---|
| JP | 4-251922 A | * | 9/1992 | ......... H01L/21/302 |
| WO | 9832154 | | 7/1998 | |

OTHER PUBLICATIONS

"Magnetic Multipole–based Reactive Ion Etching Rector", Singh et al, 1992 American Institute of Physics, vol. 60, No. 19, Mar. 11, 1992, pp. 2335–2337.

* cited by examiner

*Primary Examiner*—Gregory Mills
*Assistant Examiner*—P. Hassanzadeh
(74) *Attorney, Agent, or Firm*—Dennison, Schultz & Dougherty

(57) ABSTRACT

A method of producing a plasma by capacitive discharges between an active electrode and a passive electrode within a sealed chamber at controlled pressure, the passive electrode being placed at a given electric potential while the active electrode is fed with a discharge-maintaining voltage. The active electrode and passive electrode define a separation plane therebetween parallel to the electrodes. According to the method, a multipole magnetic barrier is placed between the electrodes within the sealed chamber, the multipole magnetic barrier producing magnetic field lines extending across the separation plane. Fast electrons accelerated by the active electrode are caused to oscillate between magnetic poles in order to create plasma production and diffusion zones that are situated on either side of a magnetic barrier facing each of the electrodes.

6 Claims, 4 Drawing Sheets

METHOD OF PRODUCING A PLASMA BY CAPACITIVE-TYPE DISCHARGES WITH A MULTIPOLE BARRIER, AND APPARATUS FOR IMPLEMENTING SUCH A METHOD

FIELD OF THE INVENTION

The invention relates to the technical field of producing medium and low pressure plasmas (of the order of a few hundredths of a Pascal to a few tens of Pascals) by capacitive-type discharges, the plasma being of uniform character suitable for being controlled firstly over large areas whether plane or otherwise, and secondly over a wide range of ion densities from high (up to $10^{12}$ cm$^{-3}$) to very low ($10^8$ cm$^{-3}$).

The invention finds particularly advantageous applications in all fields that require uniform plasmas at medium or low pressure to be produced over large areas, for performing surface treatments (cleaning, etching, deposition) and, in particular, for plasma deposition of polymers or for providing independent control of the energy with which a surface or a substrate is subjected to ion bombardment.

BACKGROUND OF THE INVENTION

In conventional manner, apparatus for producing a plasma by capacitive-type discharges comprises a passive electrode placed at a distance from an active electrode. The electrodes are mounted inside an enclosure containing gas at a substantially constant pressure. The passive electrode is placed at an electric potential, e.g. a reference potential such as ground, while the active electrode is fed with a voltage for maintaining discharge. The electric voltage applied to the active electrode is either a DC voltage which is negative relative to the passive electrode, or else a low frequency AC voltage, or more commonly a radiofrequency (RF) voltage (13.56 MHz or a multiple or a submultiple of 13.56 MHz) applied through a capacitance of low impedance. Above some value of applied voltage (which depends on the nature of the gas, on its pressure, on the distance between the electrodes, on the frequency of the applied signal, and on the nature of the electrodes and their relative dimensions), a discharge is struck between the two electrodes.

Whatever the frequency at which the voltage is applied, one of the electrodes is always negatively polarized relative to the other. Since the potential of the plasma generally takes up a value which is slightly positive relative to the more positive electrode, the more negative electrode is subjected to intense bombardment by the positive ions of the plasma that are accelerated from the plasma towards the more negative electrode through the ion sheath separating the plasma from the electrode. During this time, the more negative electrode is subjected to ion bombardment at very low energy only, insofar as its potential is then very close to the potential of the plasma.

When the ions strike the electrode that is more negative relative to the potential of the plasma, they generally emit secondary electrons which are those that are accelerated in the opposite direction towards the plasma. On passing through the inter-electrode gap, these so-called "fast" secondary electrons produce the plasma, i.e. they produce slow or thermal electrons and ions. If the mean free path of the fast electrons is greater than the inter-electrode distance (as applies at low and medium pressures), most of the fast electrons emitted by the negative electrode are subjected to few inelastic collisions, so they are not slowed down and they are therefore collected by the positive electrode. In contrast, if the mean free path of the fast electrons is shorter than the inter-electrode distance (as applies at higher pressures), then the fast electrons are slowed down by the inelastic collision processes and can in turn become slow electrons. Under steady conditions, the ions and the slow electrons produced within the plasma are lost to the walls in equal quantities, which is a condition necessary for maintaining macroscopic neutrality of the plasma.

Apart from the fast electrons emitted by the bombardment of the negative electrode of the discharge, some electrons can also be accelerated most effectively by the periodic electric field within the ion sheath. When the voltage of the electrode becomes more negative relative to the potential of the plasma, the ion sheath becomes larger and the electrons present are then pushed away and accelerated towards the plasma by the electric field which develops within the sheath. Naturally, the ions present in the sheath are accelerated in the opposite direction by the electrode. This dynamic behavior of the sheath can contribute significantly to producing fast electrons and thus to producing plasma.

A drawback of a capacitive discharge is that for a given geometrical configuration of the discharge, the conditions required for striking and above all for maintaining the discharge require a threshold voltage to be applied between the electrodes, i.e. require a threshold power in order to maintain the discharge. This puts a limit on the possibilities of producing plasma at low densities. In other words, whereas an increase in plasma density can be obtained merely by increasing the power injected into the discharge, it is not possible to decrease its density towards the lowest values.

As explained above, the operation of a capacitive discharge is determined by:

the configuration of the discharge (inter-electrode distance and ratio of electrode areas);

the nature of the gas (effective collision section);

the pressure of the gas (collision frequencies and mean free paths);

the nature of the electrodes (secondary electron emission rates);

the frequency of the applied voltage (sheath dynamic behavior, ion bombardment energy); and the electric power injected into the plasma.

The above parameters define the conditions of the discharge completely, i.e. they define its operating point. Simultaneously, those parameters govern the plasma-surface interaction parameters which are totally dependent on the operating point of the capacitive discharge. It is therefore not possible for plasma production to be independent from plasma interaction with the surface to be treated that is placed on one of the electrodes. In other words, it is not possible to adjust ion bombardment energy without modifying the power delivered to the discharge and thus the electrical characteristics of the discharge (density, electron temperature, etc.).

One option in general use for remedying that drawback is to add one or more bias electrodes for the purpose of modifying the current balance over the electrodes. Nevertheless, the additional degrees of freedom for the plasma parameters that are obtained by that method are largely counteracted by the complexity of the situation created in that way.

SUMMARY OF THE INVENTION

An object of the invention is thus to remedy the above drawback by proposing a method of producing a plasma by capacitive-type discharges produced between an active electrode and a passive electrode, the passive electrode being placed at a given electric potential, e.g. a reference potential, while the active electrode is fed with a discharge-maintaining voltage.

To achieve such an object, the method of the invention consists in placing a multipole magnetic barrier between the electrodes, the magnetic field lines thereof extending across a separation plane parallel to the electrodes so as to ensure that the fast electrons accelerated by the active electrode are caused to oscillate between the poles in order to create plasma production and diffusion zones that are situated on either side of the magnetic barrier facing each of the electrodes.

Another drawback inherent to capacitive discharges is the existence of great non-uniformity in the density of the plasma due in particular to edge effects which can be very large. The only known means used for remedying that defect is to adjust or distribute gas injection in such a manner as to correct the non-uniformity of the method implemented.

Another object of the invention is to propose a method of producing a plasma by capacitive-type discharges, the method being adapted to obtaining capacitive discharge strikes at very low or very high levels of power per unit area, while nevertheless obtaining a plasma that is uniform over large surface areas.

To achieve this object, the method of the invention consists:

in making the active electrode out of a series of individual active electrodes facing the passive electrode and each defining both an active surface and a passive surface;

in distributing the individual active electrodes in a geometrically uniform manner facing the passive electrode in order to obtain a uniform plasma; and in feeding and active surfaces of the individual active electrodes with a respective discharge-maintaining voltage.

BRIEF DESCRIPTION OF THE DRAWINGS

Other characteristics will appear on reading the following description made with reference to the accompanying drawings which show embodiments and implementations of the invention as non-limiting examples.

DESCRIPTION OF THE PREFERRED EMBODIMENTS

Figure 1A:
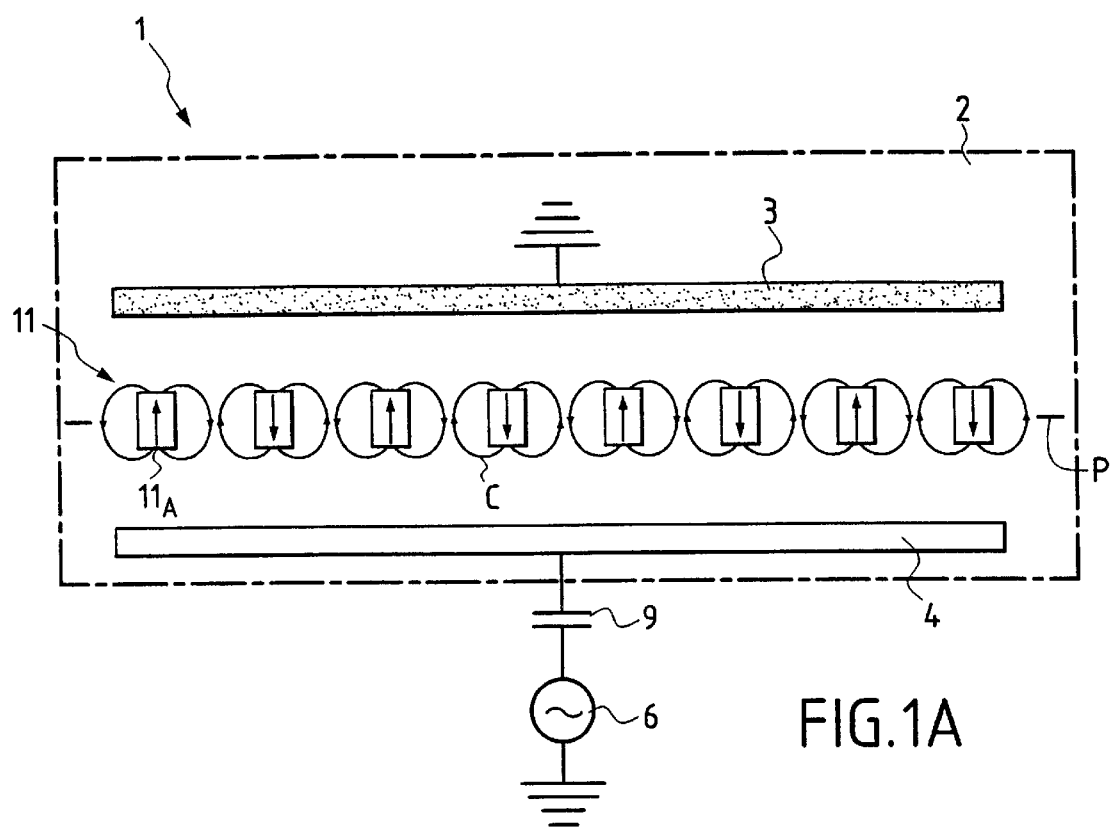
FIGS. 1A and 1B are diagrammatic views of two embodiments of plasma production apparatus implementing an advantageous characteristic of the invention.

By way of example, FIG. 1A shows apparatus 1 for producing a plasma inside a leakproof enclosure 2 which is represented diagrammatically. Such an enclosure 2 is conventionally fitted with gas insertion devices and gas pumping devices (not shown) that are known in themselves and that enable the pressure of the gas to be ionized to be maintained at a desired value which can, for example, lie in the range a few hundredths of a Pascal to a few tens of Pascals depending on the nature of the gas, the injected power, the nature of the electrodes, etc.

Inside the enclosure 2, the apparatus 1 comprises a "passive" electrode 3 placed at a given electric potential, e.g. a reference potential such as ground in the example shown. The passive electrode 3 is mounted at a distance from an active electrode 4 fed by a source 6 for producing a discharge-maintaining voltage. The source 6 is either a negative DC source or else, as shown, a source for producing a low frequency or a radiofrequency alternating voltage applied via a capacitor 9.

Figure 1B:
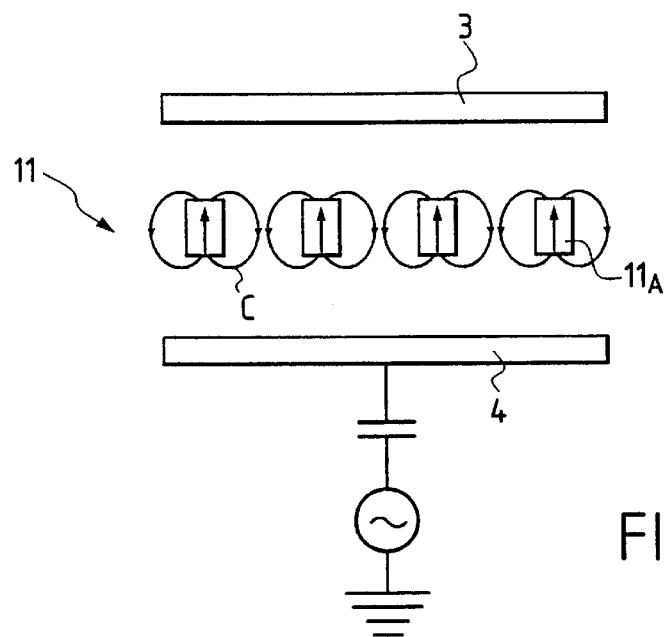

In accordance with the invention, the plasma producing apparatus 1 has a multipole magnetic barrier 11 whose magnetic field lines C extend across a separation plane P which is substantially parallel to the planes in which the electrodes 3 and 4 extend. This magnetic barrier 11 ensures that the fast electrons from the active electrode 4 oscillate between the magnetic poles so as to create plasma production and diffusion zones situated on either side of the magnetic barrier 11 facing each electrode 3, 4. In the example shown in FIG. 1A, this magnetic barrier 11 is constituted by a series of permanent magnets 11A constituting a set of magnetic tracks or three-dimensional magnetron structures over the entire working area of the discharge, with field lines which extend on either side of the separation plane P between the electrodes 3, 4. The magnets are spaced apart from one another in the plane P with their magnetization axes extending perpendicularly to the plane P, alternately in opposite directions from one magnet 11A to an adjacent magnet (FIG. 1A) or all pointing in the same direction (FIG. 1B). The advantage of such a multipole magnetic structure 11 made up of an array of permanent magnets with successively alternating magnetic polarities relates to the way magnetic field intensity decreases exponentially on going away from the magnet. Thus, the active electrode 4 and the passive electrode 3 can easily be situated outside the zone having an intensive magnetic field, i.e. in respective zones that have only residual magnetic fields. In such a discharge configuration, the fast electrons which are emitted and accelerated by the active electrode 4 and which pass across the space between the active electrode 4 and the multipole magnetic barrier 11 become trapped in large numbers in the magnetic field. Contrary to what happens in the absence of a magnetic barrier, the fast electrons when trapped in this way are no longer captured by the passive electrode 3 and they therefore produce plasma all along their trajectory in the multiple magnetic field. Consequently, at low and medium pressures, the energy of the fast electrons is no longer deposited on the passive electrodes, but is dissipated in producing plasma. Thus, for a given power density per unit area, the density of the plasma produced is significantly higher. Similarly, to strike or maintain the plasma, the decrease in fast electron losses requires secondary electrons to be emitted at a lower rate, i.e. ion bombardment energy that is lower, a lower striking or maintaining voltage, or indeed a lower power density per unit area.

Between two collisions, the trajectories of the fast electrons trapped in the multipole magnetic field are governed essentially by magnetic forces. It thus appears that the trajectories of the fast electrons wind around the magnetic field lines interconnecting opposite magnetic poles, and that they oscillate between mirror points situated close to said opposite magnetic poles. In addition, the fast electrons drift slowly in a direction perpendicular to the magnetic field and can thus travel over all of or part of the magnetic circuit of the three-dimensional magnetron structure. Since the magnetic field lines extend through the multipole barrier (the separation plane P) and are generally symmetrical on either side of each magnetron structure constituting the multipole barrier, the fast electrons trapped in the magnetic field thus produce, i.e. along their trajectories, equal amounts of plasma on either side of the multipole barrier. Consequently, a plasma is obtained on the same side as the passive electrode 3 that has characteristics which are decoupled from those of the plasma produced on the same side as the active electrode 4.

According to an advantageous characteristic of the invention, it is then possible to bias the passive electrode 3 relative to the potential of the plasma by applying a bias voltage, e.g. a negative DC or periodic voltage, and this can be done independently of plasma production. It is thus possible to obtain decoupling between plasma production and the bias applied to the passive electrode 3 on which, for example, there can be placed a surface for treatment.

Figure 2A:
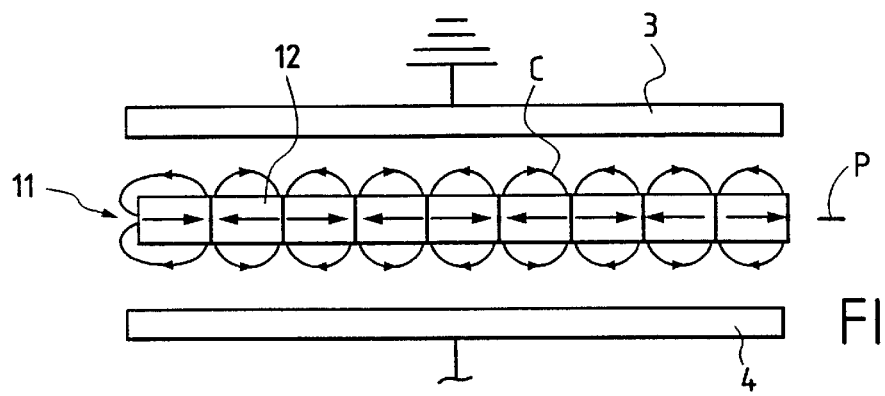
FIGS. 2A and 2B are diagrammatic front and side views of another embodiment of plasma production apparatus in accordance with the invention.
Figure 2B:
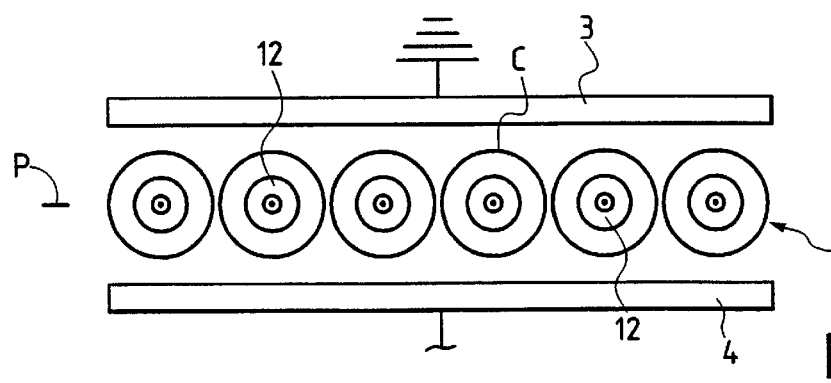

FIGS. 2A and 2B show a variant embodiment of the multiple barrier 11 made up of bars of magnets 12 placed close to one another in the plane P and each being made up of a series of adjacent magnets having their magnetization axes extending in the plane P, and alternating from one magnet to the next.

Figure 3A:
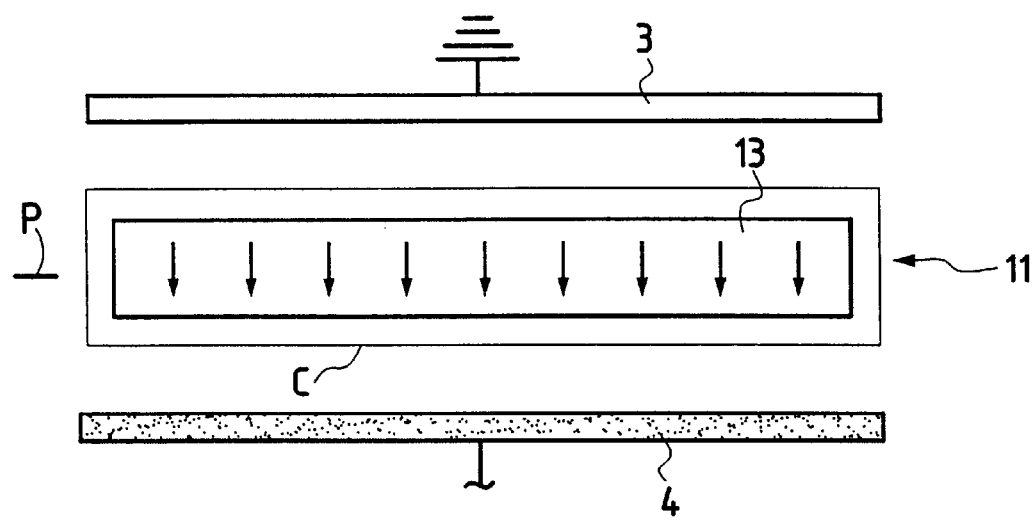
FIGS. 3A and 3B are diagrammatic front and side views of another embodiment of plasma production apparatus in accordance with the invention.
Figure 3B:
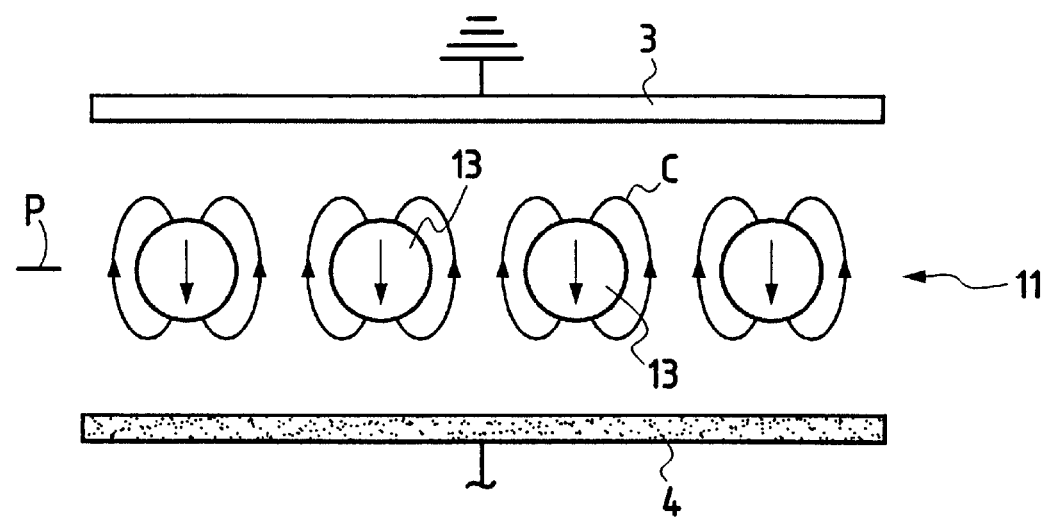

FIGS. 3A and 3B show another variant embodiment of the multiple barrier 11 made up of bars of magnets 13 placed close to one another in the plane P and each being constituted by a magnet whose magnetization axis extends perpendicularly to the plane P. Such a linear magnetization structure along one of the dimensions of the enclosure favors obtaining a plasma that is uniform when the ratio of the active areas 5 over the sum of the active areas 5 plus the passive areas 8 is small.

Figure 4:
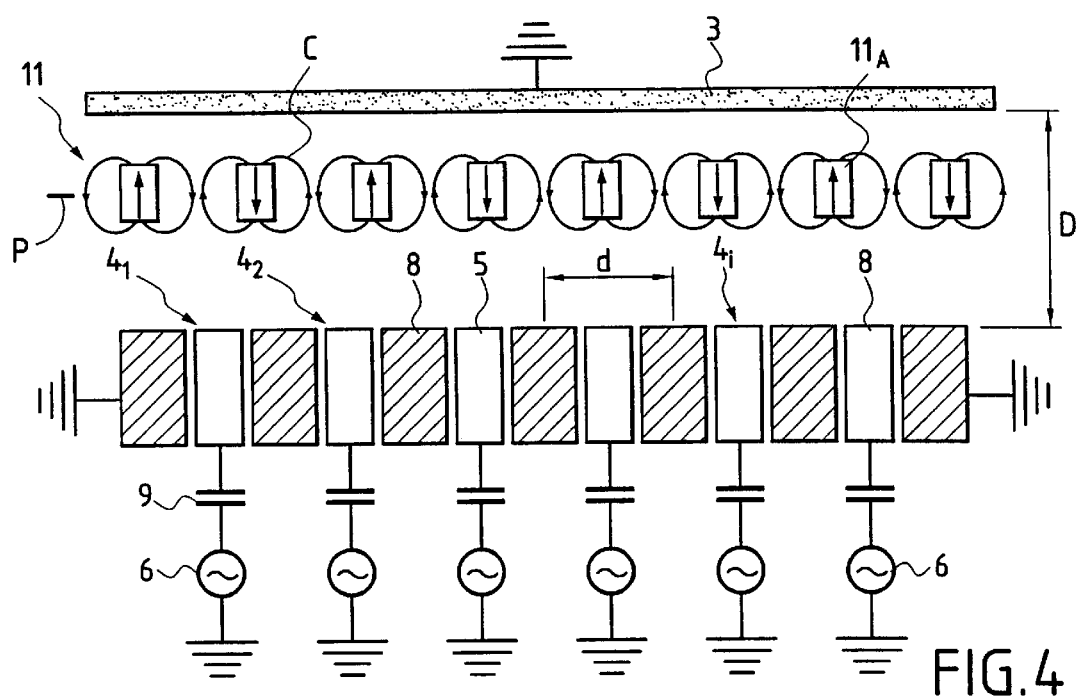
FIG. 4 shows an embodiment of plasma production apparatus in accordance with the invention that implements another advantageous characteristic.

In accordance with another characteristic of the invention, as shown in FIG. 4, the active electrode 4 is constituted by a series of individual active electrodes $4_1$, $4_2$, $4_3$, ..., $4_i$ distributed in a geometrically uniform manner facing the passing electrode 3. Each individual active electrode $4_i$ facing the passive electrode 3, defines firstly an active surface 5 fed by a source 6 for producing a discharge-maintaining voltage, and secondly a passive surface 8 placed at a given electric potential, e.g. a reference potential, such as ground in the example shown. Each source 6 is either a source that produces a negative DC voltage, or as shown in FIG. 4, a source that produces a low frequency or a radiofrequency AC voltage which is applied via a capacitor 9.

Given the uniform distribution of the individual active electrodes $4_i$, the active surfaces 5 of the electrodes are preferably all of the same surface area, and the passive surfaces 8 of the individual active electrodes $4_i$ are also preferably all of the same area. Furthermore, the discharge voltage delivered by the sources 6 is applied in distributed manner solely over a small percentage of the area of the active electrode 4, i.e. its active surfaces 5, while the other fraction of the area of the active electrode (its passive surfaces 8) is maintained at the reference potential. It should be understood that the active surfaces 5 of the active electrode are small relative to the area of the passive electrode 3, so that there appears large mean negative bias of the active electrode 4 relative to the potential of the plasma. Such a situation corresponds to fast electrons being emitted at the greatest rate and to electrons being subjected to the greatest acceleration in the ion sheath, and is thus more favorable to obtaining a plasma strike facing each active surface 5. Naturally, the smaller the total area of the active surfaces 5 compared with the total area of the electrode 4, the smaller the power density required per unit area for striking and then maintaining the plasma.

According to an advantageous characteristic of the invention, each individual active electrode $4_i$ is fed by an adjustable voltage source 6 enabling the power on each of the individual active electrodes $4_i$ to be adjusted in such a manner as to control the level of the plasma-maintaining power density. Each individual active electrode $4_i$ can be fed with a discharge-maintaining voltage that thus presents a determined value which is identical or different in order to obtain a plasma which is uniform. Naturally, the individual active electrode $4_i$ can be fed with electrical power either via independent sources (transistors), or from a single source followed by a circuit for adjusting and distributing power. According to another characteristic of the invention, the distance d between two adjacent individual active electrodes $4_i$ is selected in such a manner as to be less than or equal to the distance D between the passive electrode 3 and the active electrode 4. This makes it possible to obtain relative satisfactory uniformity of the plasma.

Figure 5:
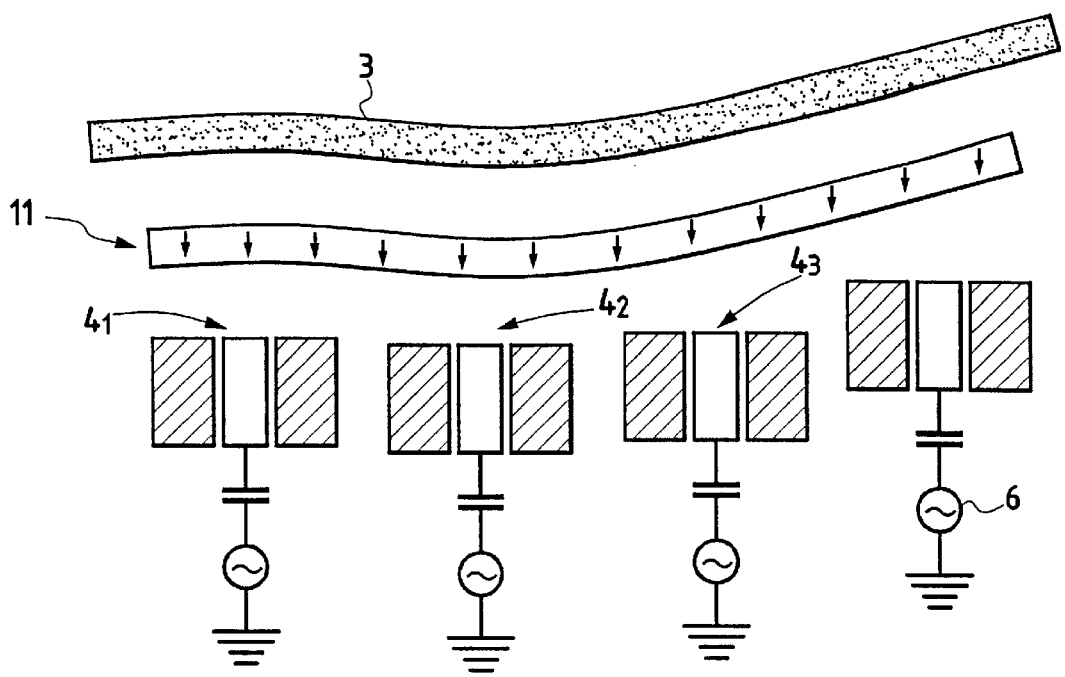
FIGS. 5 and 6 show various geometrical shapes that can be taken up by the plasma production apparatus as shown in FIG. 4.
Figure 6:
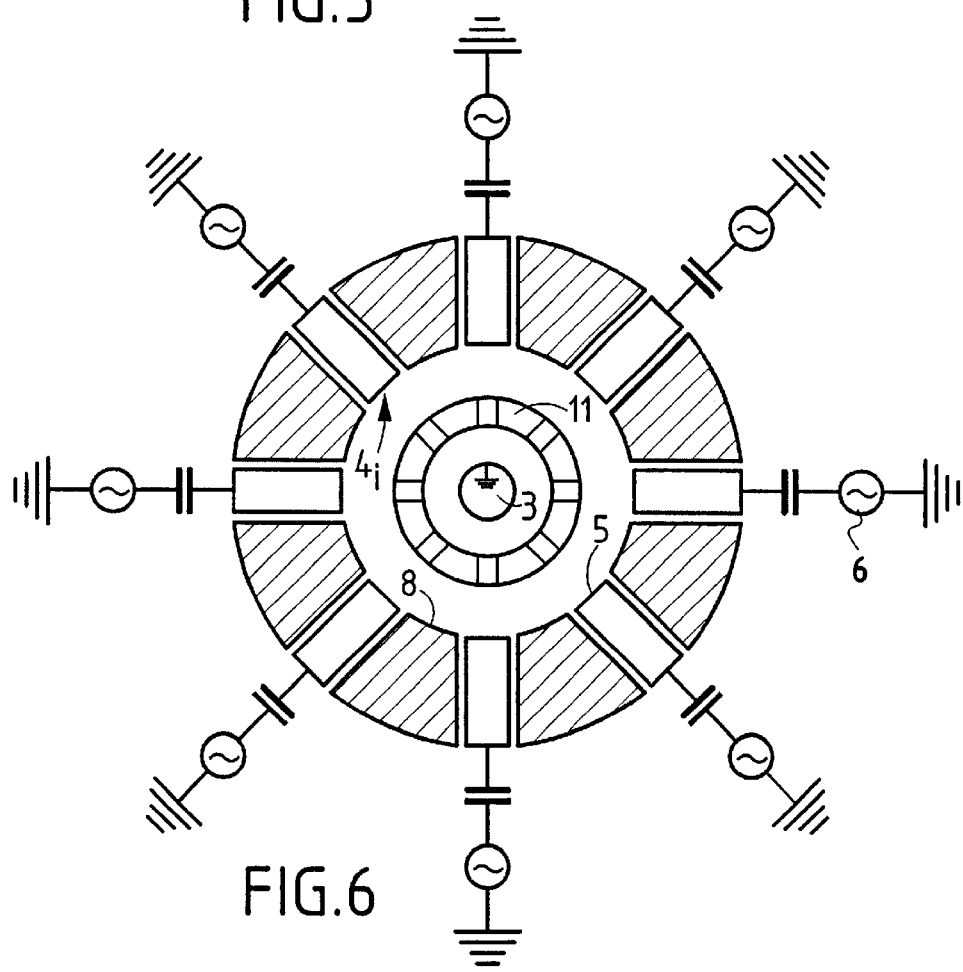

The invention has the advantage of being able to treat plane surfaces that are placed facing the active electrodes and also surfaces that are not plane, e.g. surfaces that are warped or cylindrical as shown in FIG. 5 or FIG. 6. In FIG. 6, the individual active electrodes $4_i$ are distributed around a circumference inside which there is placed a passive electrode 3 of circular section at a distance therefrom.

The individual active electrodes $4_i$ have conductive active surfaces 5 (made of metal or semiconductor), but they may be covered in a thin layer of dielectric if a periodic voltage is applied (RF discharge). The individual active electrodes $4_i$ comprise a passive surface 8 generally constituted by metal shielding taken to a given electric potential, e.g. a reference potential such as ground. The passive surfaces 8 of the active electrodes $4_i$ can also be isolated by a dielectric screen or by a thick dielectric layer. The active electrodes $4_i$ can also be cooled, if necessary.

Power distribution over a set of individual active electrodes $4_i$ makes it possible firstly to reduce the level of power required for striking the plasma to values that are very low, and secondly to adjust the uniformity of the plasma in controlled manner, or indeed to make it possible to treat surfaces that are not plane (cylindrical), or indeed warped surfaces. Furthermore, the multipole barrier 11 with magnetron tracks presents two decisive advantages: firstly it makes it possible to bias the substrates in independent manner; and secondly it makes it possible to increase the density of the plasma significantly for constant power density per unit area.

All of these advantages make it possible to envisage plasma applications that have not been previously been possible with capacitive discharges. In addition to the new ranges of applications made possible in this way, the invention also makes it possible to obtain greater reliability since by applying lower nominal powers to each of the active electrodes, it is possible to increase the lifetime of the components of the electrical circuit very significantly and thus to increase the operating reliability of the plasma. Finally, the invention makes it possible to extend the plasma scale without any limitations other than technological limitations (the forces of atmospheric pressure on the enclosure, magnetic forces, etc.).

As examples of treatments that can be performed in these novel reactors, mention can be made of depositing polymers (polymers having controlled functional properties, biopolymers, photosensitive resins, etc.), depositing amorphous silicon (with adjusted hydrogen concentration) or crystalline silicon, depositing silicon alloys (silica, silicon nitride, oxynitrides, etc.), etching operations, and more generally all conventional kinds of plasma treatment.

The plasmas of the invention are well adapted to treating large plane surface areas (of square meter order or greater) such as panels of solar cells or flat screens, or warped surfaces such as windows for vehicles, for example, which require very good uniformity over large dimensions.

The invention is not limited to the examples described and shown since various modifications can be applied thereto without going beyond the ambit of the invention.

What is claimed is:

1. A method of producing a plasma by capacitive discharges produced between an active electrode and a passive electrode within a sealed chamber at controlled pressure, the passive electrode being placed at a given electric potential while the active electrode is fed with a discharge-maintaining voltage, the active electrode and passive electrode defining a separation plane therebetween parallel to the electrodes, the method comprising placing a multipole magnetic barrier between the electrodes within the sealed chamber, the multipole magnetic barrier producing magnetic field lines extending across the separation plane, whereby fast electrons accelerated by the active electrode are caused to oscillate between magnetic poles in order to create plasma production and diffusion zones that are situated on either side of a magnetic barrier facing each of the electrodes.

2. A method according to claim 1, wherein the passive electrode is placed at an electric potential which corresponds to a bias potential so as to enable the passive electrode to be biased independently of plasma production.

3. A method according to claim 1, wherein the active electrode is made out of a series of individual active electrodes facing the passive electrode and each defining both an active surface and a passive surface;

wherein the individual active electrodes are distributed in a geometrically uniform manner facing the passive electrode in order to obtain a uniform plasma; and wherein active surfaces of the individual active electrodes are fed with a respective discharge-maintaining voltage.

4. A method according to claim 3, wherein a ratio of the active surface areas divided by the passive surface areas of the individual active electrodes is defined in such a manner as to control the level of the plasma maintaining power density.

5. A method according to claim 3, wherein a distance between two adjacent individual active electrodes is determined in such a manner as to ensure that it is less than or equal to the distance between the passive electrode and the active electrode.

6. A method according to claim 3, wherein each of the individual, active electrodes is fed with a discharge-maintaining voltage of identical or different determined value for the purpose of obtaining a plasma that is uniform.

* * * * *